(12) United States Patent
Kim et al.

(10) Patent No.: US 8,362,457 B2
(45) Date of Patent: Jan. 29, 2013

(54) SEMICONDUCTOR DEVICE AND METHOD FOR FABRICATING THE SAME

(75) Inventors: Sook-Joo Kim, Gyeonggi-do (KR); Min-Gyu Sung, Gyeonggi-do (KR); Deok-Sin Kil, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 87 days.

(21) Appl. No.: 12/954,127

(22) Filed: Nov. 24, 2010

(65) Prior Publication Data

US 2011/0248236 A1 Oct. 13, 2011

(30) Foreign Application Priority Data

Apr. 8, 2010 (KR) .................. 10-2010-0032396

(51) Int. Cl.
 *H01L 47/00* (2006.01)
(52) U.S. Cl. .................. 257/4; 257/E47.001
(58) Field of Classification Search ....... 257/4, E47.001; 438/128, 132
See application file for complete search history.

(56) References Cited

U.S. PATENT DOCUMENTS 7,871,866 B2 * 1/2011 Jeong et al. .................. 438/128

FOREIGN PATENT DOCUMENTS

| JP | 2006-245322 | 9/2006 |
|---|---|---|
| KR | 1020080050989 | 6/2008 |
| KR | 1020090108221 | 10/2009 |
| KR | 10-2010-0009722 | 1/2010 |

OTHER PUBLICATIONS

Notice of Allowance issued from Korean Intellectual Property Office on Nov. 30, 2011.
Notice of Preliminary Rejection issued from Korean Intellectual Property Office on Jul. 28, 2011.
H. Y. Lee et al., "Low Power and High Speed Bipolar Switching with A Thin Reactive Ti Buffer Layer in Robust HfO2 Based RRAM," IEEE Xplore, total 4 pages.

* cited by examiner

*Primary Examiner* — Quoc Hoang
(74) *Attorney, Agent, or Firm* — IP & T Group LLP

(57) ABSTRACT

A semiconductor device includes a lower electrode, a variable resistance layer disposed over the lower electrode, the variable resistance layer is included a reactive metal layer being interposed between a plurality of oxide resistive layers and an upper electrode disposed over the variable resistance layer.

23 Claims, 8 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2010-0032396, filed on Apr. 8, 2010, which is incorporated herein by reference in its entirety.

BACKGROUND OF THE INVENTION

Exemplary embodiments of the present invention relate to a technology for fabricating a semiconductor device, and more particularly, to a semiconductor device using a change in electrical resistance such as a non-volatile Resistive Random Access Memory (ReRAM), and a method for fabricating the same.

Recently, researchers are studying to develop next-generation memory devices that may substitute Dynamic Random Access Memory (DRAM) and flash memory. Among the next-generation memory devices is a ReRAM, which is a semiconductor device that performs switching between at least two different electrical resistance states.

FIG. 1 is a cross-sectional view illustrating a semiconductor device using a change in electrical resistance according to a prior art.

Referring to FIG. 1, the conventional semiconductor device using a change in electrical resistance may have a structure where a variable resistance layer 13 may be interposed between a lower electrode 11 and an upper electrode 12. The variable resistance layer 13 may be formed of a transition metal oxide (TMO), and the variable resistance layer 13 formed of a transition metal oxide may include a plurality of vacancies inside, which may be oxygen vacancies.

A switching mechanism of the semiconductor device having the above-described structure is as follows.

When a bias is applied to the lower electrode 11 and the upper electrode 12, the vacancies inside the variable resistance layer 13 may be rearranged according to the applied bias. As a result of the vacancy rearrangement, conductive filament may be generated or pre-existing conductive filament may be deconstructed. According to the generation or deconstructing of the conductive filament inside the variable resistance layer 13, the variable resistance layer 13 may represent two different resistance states. To be specific, when the conductive filament is generated, the variable resistance layer 13 may represent a low electrical resistance state. When the conductive filament is deconstructed, the variable resistance layer 13 may represent a high electrical resistance state. Further, an operation that generates the conductive filament inside the variable resistance layer 13 so that the variable resistance layer 13 represents a low electrical resistance state may be called a set operation, and an operation that deconstructs a pre-existing conductive filament so that the variable resistance layer 13 represents a high electrical resistance state may be called a reset operation.

In the conventional semiconductor device, the variable resistance layer 13 may be formed through a Physical Vapor Deposition (PVD) process or an Atomic Layer Deposition (ALD) process. Here, as the variable resistance layer 13 has a uniform thickness, stable switching characteristics may be secured. Therefore, it may be more beneficial to use the atomic layer deposition method than the physical vapor deposition method to form the variable resistance layer 13.

However, since the variable resistance layer 13 formed through the atomic layer deposition process may have a stoichiometrically stable structure where little impurity exists inside the layer, it may include a small number of oxygen vacancies generated inside the variable resistance layer 13, compared with a variable resistance layer 13 formed through the physical vapor deposition process. Here, if the number of oxygen vacancies inside the variable resistance layer 13 is relatively low, the operation characteristics of the semiconductor device using a change in electrical resistance may deteriorate, such as switching characteristics, endurance characteristics, and set/reset operation characteristics, e.g., set/reset current and set/reset time may deteriorate. In particular, the number of oxygen vacancies inside the variable resistance layer may greatly affect the switching characteristics of the semiconductor device using a change in electrical resistance.

Therefore, in order for the variable resistance layer 13 formed through atomic layer deposition process to secure the switching characteristics, it may be more beneficial that the variable resistance layer 13 is formed thinner than the variable resistance layer 13 formed through the physical vapor deposition process. However, if the variable resistance layer 13 is thin, a leakage current path may be formed inside of the variable resistance layer 13, and thus a power consumption of the semiconductor device may increase.

FIG. 2 is a cross-sectional view illustrating a known semiconductor device using a change in electrical resistance according to an improved prior art.

Referring to FIG. 2, the semiconductor device fabricated according to the improved prior art includes a variable resistance layer 13 interposed between a lower electrode 11 and an upper electrode 12, and a reactive metal layer 14 is interposed between the variable resistance layer 13 and the upper electrode 12.

However, since the semiconductor device fabricated according to the improved prior art includes the reactive metal layer 14 disposed over the variable resistance layer 13, oxygen vacancies, which are supposed to be generated inside the variable resistance layer 13, may be generated, for example, only at the interface where the variable resistance layer 13 and the reactive metal layer 14 contact each other. For this reason, the switching characteristics required to secure a performance of a semiconductor device using a change in electrical resistance may be achieved only when the variable resistance layer 13 is thin. Therefore, although there is the reactive metal layer 14 formed in the semiconductor device, the power consumption may increase due to leakage current.

SUMMARY OF THE INVENTION

Exemplary embodiments of the present invention are directed to a semiconductor device which may secure desirable operation characteristics, a semiconductor device using a change in electrical resistance with reduced power consumption, and a method for fabricating the semiconductor device.

In accordance with an exemplary embodiment of the present invention, a semiconductor device may includes a lower electrode; a variable resistance layer disposed over the lower electrode, the variable resistance layer is included a reactive metal layer being interposed between a plurality of oxide resistive layers; and an upper electrode disposed over the variable resistance layer.

In accordance with another exemplary embodiment of the present invention, a semiconductor device may included a lower electrode; an upper electrode; and a variable resistance layer arranged between the lower electrode and the upper electrode, wherein the variable resistance layer is included a plurality of oxide resistive layers and a plurality of reactive metal layers formed between each of the plurality of oxide resistive layers.

DESCRIPTION OF SPECIFIC EMBODIMENTS

Figure 1:
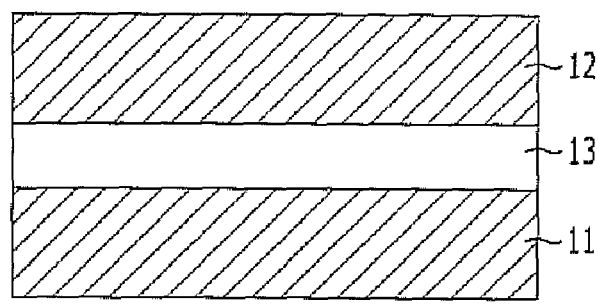
FIG. 1 is a cross-sectional view illustrating a semiconductor device using a change in electrical resistance according to a prior art.
Figure 2:
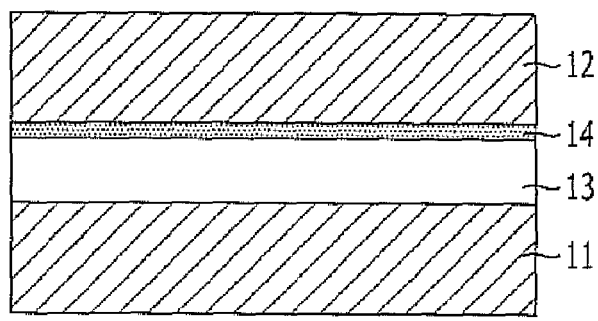
FIG. 2 is a cross-sectional view illustrating a known semiconductor device using a change in electrical resistance according to an improved prior art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The present invention which will be described hereafter provides a semiconductor device using a change in electrical resistance that may secure desirable operation characteristics such as switching characteristics, endurance characteristics and set/reset operation characteristics, and reduce power consumption. Also, the present invention which will be described provides a method for fabricating the semiconductor device.

The semiconductor device using a change in electrical resistance in accordance with an exemplary embodiment of the present invention, which is illustrated in FIGS. 3A to 3D, and the semiconductor device using a change in electrical resistance in accordance with another exemplary embodiment of the present invention, which is illustrated in FIGS. 4A to 4D may have the following in common.

The semiconductor device using a change in electrical resistance may include a lower electrode 21, 31, an upper electrode 22, 32, oxide resistive layers 23A, 23B, 33A, 33B, 33X, 33Y, at least a reactive metal layer 24, 25, 26, 34A, 34B, ..., 34Y, 34Z.

Each of the lower electrodes 21, 31 and the upper electrodes 22, 32 may be a single layer selected from the group consisting of a platinum (Pt) layer, an iridium (Ir) layer, a gold (Au) layer, a ruthenium (Ru) layer, an iridium oxide ($IrO_2$) layer, a ruthenium oxide ($RuO_2$) layer, a titanium nitride (TiN) layer, and a tantalum nitride (TaN) layer, or a stacked layer where more than two of them are stacked.

The oxide resistive layers 23A, 23B, 33A, 33B, ..., 33X, 33Y may function as a major factor for a changed electrical resistance value, and the oxide resistive layers 23A, 23B, 33A, 33B, ..., 33X, 33Y may have a plurality of vacancies, e.g., oxygen vacancies. Here, the oxide resistive layers 23A, 23B, 33A, 33B, ..., 33X, 33Y may generate conductive filament or deconstruct the conductive filament by re-arranging the oxygen vacancies according to a bias applied through the lower electrodes 21, 31 and the upper electrodes 22, 32, Consequently, the electrical resistance value of the oxide resistive layers 23A, 238, 33A, 33B, ..., 33X, 33Y may change.

The oxide resistive layers 23A, 23B, 33A, 33B, ..., 33X, 33Y may include a transition metal oxide. For example, the oxide resistive layers 23A, 23B, 33A, 33B, ..., 33X, 33Y may be one selected from the group consisting of a titanium oxide ($TiO_x$) layer, a hafnium oxide ($HfO_x$) layer, a niobium oxide ($NbO_x$) layer, a nickel oxide ($NiO_x$) layer, a lanthanum oxide ($LaO_x$) layer, a tungsten oxide ($WO_x$) layer, and a zirconium oxide ($ZrO_x$) layer.

The reactive metal layers 24, 25, 26, 34A, 348, ..., 34Y, 34Z may improve operation characteristics of a semiconductor device using a change in electrical resistance by increasing the number of oxygen vacancies inside the oxide resistive layers 23A, 23B, 33A, 33B, ..., 33X, 33Y. Particularly, the reactive metal layers 24, 25, 26, 34A, 34B, ..., 34Y, 34Z may improve switching characteristics. To this end, the reactive metal layers 24, 25, 26, 34A, 348, ..., 34Y, 34Z may include a metal having a greater reactivity with respect to oxygen than the oxide resistive layers 23A, 23B, 33A, 33B, ..., 33X, 33Y. In the end, the metal may be a metal oxide oxidized by gathering oxygen from the oxide resistive layers 23A, 23B, 33A, 33B, ..., 33X, 33Y.

As for the reactive metal layers 24, 25, 26, 34A, 348, ..., 34Y, 34Z, such metals as aluminum (Al), gadolinium (Gd), zirconium (Zr), titanium (Ti), copper (Cu), tantalum (Ta), or tungsten (W) may be used. The reactivities of the metals with respect to oxygen may be represented as follows: Al>Gd>Zr>Ti>Cu>Ta>W.

For example, if the oxide resistive layers 23A, 23B, 33A, 33B, ..., 33X, 33Y are formed of titanium oxide ($TiO_x$), the reactive metal layer 24, 25, 26, 34A, 34B, ..., 34Y, 34Z may include aluminum (Al), gadolinium (Gd), zirconium (Zr), or titanium (Ti) which has a greater reactivity with respect to oxygen than titanium oxide ($TiO_x$). In the end, the reactive metal layer 24, 25, 26, 34A, 34B, ..., 34Y, 34Z may include aluminum oxide ($AlO_x$), gadolinium oxide ($GdO_x$), zirconium oxide ($ZrO_x$), or titanium oxide ($TiO_x$). Here, titanium oxide may have a greater reactivity with respect to oxygen than titanium.

The reactive metal layers 24, 25, 26, 34A, 34B, ..., 34Y, 34Z may include a plurality of oxygen vacancies. In other words, the reactive metal layer 24, 25, 26, 34A, 34B, ..., 34Y, 34Z, which is oxidized by gathering oxygen from the oxide resistive layer 23A, 23B, 33A, 33B, ..., 33X, 33Y, may have a stoichiometrically unstable state due to oxygen vacancies therein. For this reason, it may be said that the reactive metal layer 24, 25, 26, 34A, 34B, ..., 34Y, 34Z may participate in changing the electrical resistance value. That is, the reactive metal layer 24, 25, 26, 34A, 34B, ..., 34Y, 34Z also may generate conductive filament or deconstruct the conductive filament through rearrangement of the oxygen vacancies depending on the bias applied through the lower electrode 21 and the upper electrode 22.

The oxide resistive layer 23A, 23B, 33A, 33B, ..., 33X, 33Y and the reactive metal layer 24, 25, 26, 34A, 34B, ..., 34Y, 34Z may be formed through an Atomic Layer Deposition (ALD) process, a Chemical Vapor Deposition (CVD) process, or a Physical Vapor Deposition (PVD) process. For example, the oxide resistive layer 23A, 23B, 33A, 33B, ..., 33X, 33Y and the reactive metal layer 24, 25, 26, 34A, 34B, ..., 34Y, 34Z may be formed through the ALD process in order to improve the operation characteristics, particularly, switching characteristics, of the semiconductor device using a change in electrical resistance. This is because the formed layers may become more uniform if they are formed through the ALD process than if they are formed through the CVD process or the PVD process. Also, the oxide resistive layer 23A, 23B, 33A, 33B, ..., 33X, 33Y and the reactive metal layer 24, 25, 26, 34A, 34B, ..., 34Y, 34Z may be formed in-situ. Meanwhile, although the oxide resistive layer 23A, 23B, 33A, 33B, ..., 33X, 33Y is formed through the ALD process, the operation characteristics of the semiconductor device using a change in electrical resistance may not be deteriorated because a sufficient amount of oxygen vacancies required by the semiconductor device using a change in electrical resistance may be generated inside the oxide resistive layer 23A, 23B, 33A, 33B, ..., 33X, 33Y due to the reactive metal layer 24, 25, 26, 34A, 34B, ..., 34Y, 34Z.

The thickness T1 of the oxide resistive layer 23A, 23B, 33A, 33B, ..., 33X, 33Y may be larger than the thickness T2 of the reactive metal layer 24, 25, 26, 34A, 34B, ..., 34Y, 34Z so that oxygen vacancies generated inside the oxide resistive layer 23A, 23B, 33A, 33B, ..., 33X, 33Y are uniformly distributed inside the oxide resistive layer 23A, 23B, 33A, 33B, ..., 33X, 33Y. If the thickness T1 of the oxide resistive layer 23A, 23B, 33A, 33B, ..., 33X, 33Y is thinner than the thickness T2 of the reactive metal layer 24, the number of the oxygen vacancies inside the oxide resistive layer 23A, 23B, 33A, 33B, ..., 33X, 33Y may increase to an unnecessary level. Here, if the oxygen vacancies inside the oxide resistive layer 23A, 23B, 33A, 33B, ..., 33X, 33Y increase to an unnecessary level, A conductive filament may be formed inside the oxide resistive layer 23A, 23B, 33A, 33B, ..., 33X, 33Y although no bias is applied to the lower electrode 21 and the upper electrode 22, and thus, a leakage current path may be formed. In short, power consumption of the semiconductor device using a change in electrical resistance may be increased.

Accordingly, the reactive metal layer 24, 25, 26, 34A, 34B, ..., 34Y, 34Z may have a thickness T2 ranging from approximately 1% to approximately 10% of the thickness T1 of the oxide resistive layer 23A, 23B, 33A, 33B, ..., 33X, 33Y in order to generate enough oxygen vacancies inside the oxide resistive layer 23A, 23B, 33A, 33B, ..., 33X, 33Y so that the oxygen vacancies are uniformly distributed inside the oxide resistive layer 23A, 23B, 33A, 33B, ..., 33X, 33Y. For example, the oxide resistive layer 23A, 23B, 33A, 33B, ..., 33X, 33Y may have a thickness ranging from approximately 10 nm to approximately 100 nm, and the reactive metal layer 24, 25, 26, 34A, 34B, ..., 34Y, 34Z may have a thickness ranging from approximately 1 nm to approximately 10 nm.

Here, if the thickness T2 of the reactive metal layer 24, 25, 26, 34A, 34B, ..., 34Y, 34Z exceeds 10% of the thickness T1 of the oxide resistive layer 23A, 23B, 33A, 33B, ..., 33X, 33Y, the oxygen vacancies may be generated inside the oxide resistive layer 23A, 23B, 33A, 33B, ..., 33X, 33Y more than a necessary amount, or the oxygen vacancies generated inside the reactive metal layer 24, 25, 26, 34A, 34B, ..., 34Y, 34Z may be less than a necessary amount. Since the reactive metal layer 24, 25, 26, 34A, 34B, ..., 34Y, 34Z may be formed through oxidization by gathering oxygen from the oxide resistive layer 23A, 23B, 33A, 33B, ..., 33X, 33Y and may change the electrical resistance value, the operation characteristics, for example, switching characteristics, endurance characteristics, and set/reset operation characteristic, may deteriorate if a sufficient amount of oxygen vacancies are not generated inside the reactive metal layer 24, 25, 26, 34A, 34B, ..., 34Y, 34Z. If the thickness T2 of the reactive metal layer 24, 25, 26, 34A, 34B, ..., 34Y, 34Z is less than approximately 1% of the thickness T1 of the oxide resistive layer 23A, 23B, 33A, 33B, ..., 33X, 33Y, a sufficient amount of oxygen vacancies may not be generated inside the oxide resistive layer 23A, 23B, 33A, 33B, ..., 33X, 33Y and the oxygen vacancies may be distributed on the interface between the oxide resistive layer 23A, 23B, 33A, 33B, ..., 33X, 33Y and the reactive metal layer 24, 25, 26, 34A, 34B, ..., 34Y, 34Z, such that a non-uniform distribution of oxygen vacancies results inside the oxide resistive layer 23A, 23B, 33A, 33B, ..., 33X, 33Y.

In sum, the semiconductor device using a change in electrical resistance fabricated according to the exemplary embodiments of the present invention may improve the operation characteristics and reduce the power consumption caused by leakage current.

FIGS. 3A to 3D are cross-sectional views illustrating a semiconductor device using a change in electrical resistance in accordance with an exemplary embodiment of the present invention.

Referring to FIGS. 3A to 3D, the semiconductor device using a change in electrical resistance fabricated in accordance with an exemplary embodiment of the present invention may include a lower electrode 21, a first oxide resistive layer 23B formed over the lower electrode 21, a reactive metal layer 24 formed over the first oxide resistive layer 23B, a second oxide resistive layer 23A formed over the reactive metal layer 24, and an upper electrode 22 formed over the second oxide resistive layer 23A.

Figure 3A:
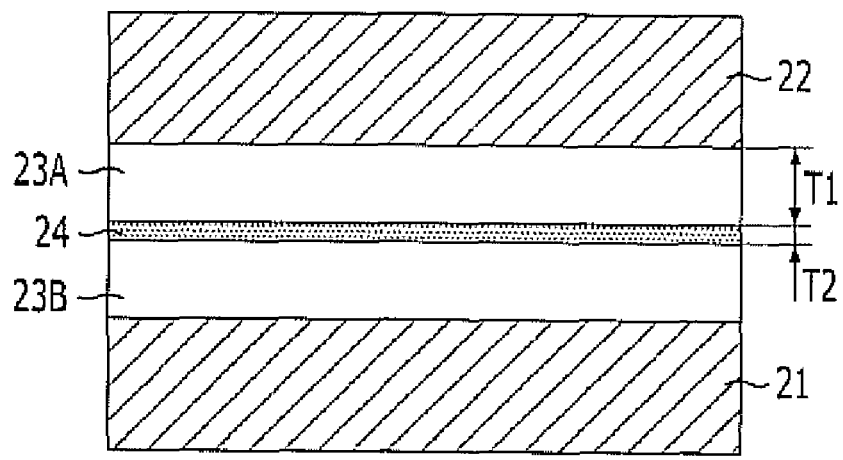
FIGS. 3A to 3D are cross-sectional views illustrating a semiconductor device using a change in electrical resistance in accordance with an exemplary embodiment of the present invention.
Figure 3B:
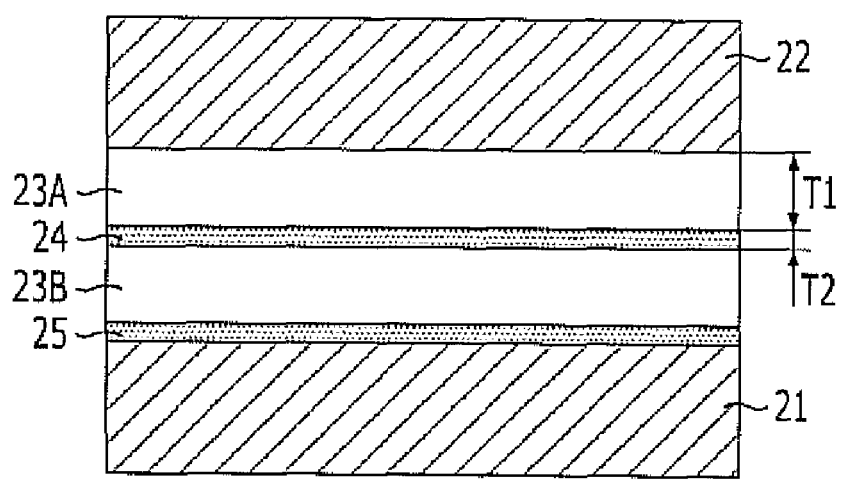
Figure 3C:
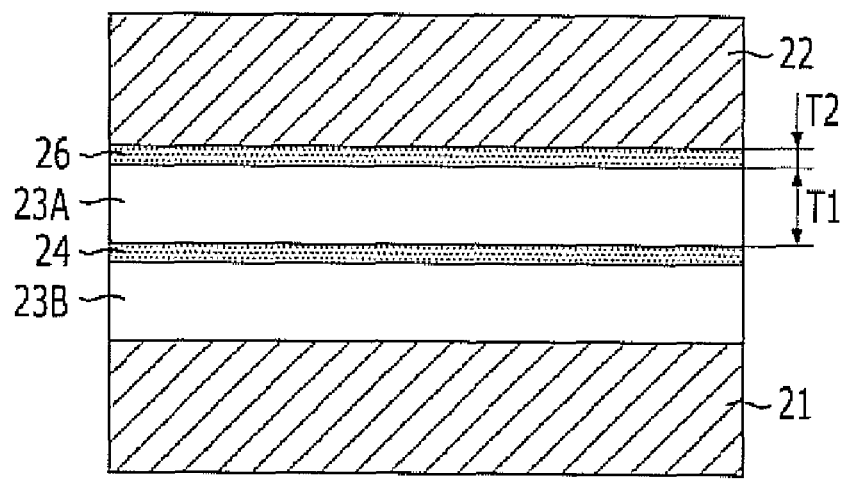
Figure 3D:
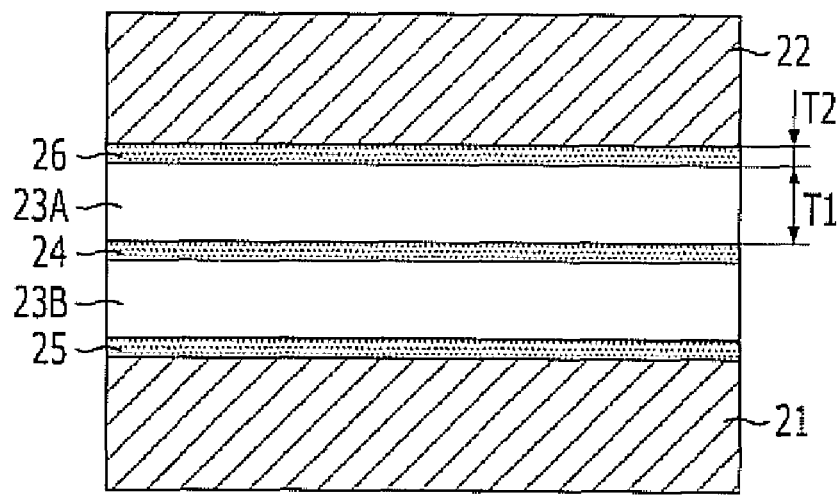

Here, the reactive metal layer 24 may be interposed between two oxide resistive layers 23A, 23B, as shown in FIG. 3A. Additionally, the reactive metal layer 25 may be interposed between the lower electrode 21 and the first oxide resistive layer 23B, as illustrated in FIG. 3B. Alternatively, the reactive metal layer 26 may be interposed between the upper electrode 22 and the second oxide resistive layer 23A, as illustrated in FIG. 3C. Or, as illustrated in FIG. 3D, the reactive metal layer 24 may be interposed between the two oxide resistive layers 23A, 23B, the reactive metal layer 25 may be interposed between the lower electrode 21 and the first oxide resistive layer 23B, and the reactive metal layer 26 may be interposed between the upper electrode 22 and the second oxide resistive layer 23A.

The reactive metal layer 24 may generate oxygen vacancies inside both of the oxide resistive layers 23A and 23B. Here, the oxygen vacancies generated inside the first and second oxide resistive layers 23A and 23B may have a uniform distribution. Moreover, since the reactive metal layer 24 is interposed between the first and second oxide resistive layers 23A and 23B, a generation of a leakage current path may decrease.

The first and second oxide resistive layers 23A and 23B may include a transition metal oxide and they may be formed of the identical transition metal oxide or different transition metal oxides.

For example, referring to FIG. 3A, the first and second oxide resistive layers 23A and 23B may both be formed of titanium oxide ($TiO_x$). However, in another case, the first oxide resistive layer 23A may be formed of titanium oxide ($TiO_x$) and the second oxide resistive layer 23B may be formed of nickel oxide ($NiO_x$).

The reactive metal layers 24, 25, 26 may be a single layer including any one metal or a stacked layer including different metals. Here, the metal may have a greater reactivity with respect to oxygen than the oxide resistive layers 23A, 23B which the reactive metal layers 24, 25, 26 contact. For example, with reference to FIG. 3D, if the oxide resistive layers 23A, 23B are titanium oxide ($TiO_x$) layers, each of the reactive metal layers 24, 25, and 26 may be a single layer selected from the group consisting of an aluminum (Al) layer, a gadolinium (Gd) layer, a zirconium (Zr) layer, and a titanium (Ti) layer whose reactivity with respect to oxygen is greater than that of the titanium oxide ($TiO_x$) layer, or a stacked layer where two or more of such metals are stacked. Or, if the second oxide resistive layer 23A is formed of titanium oxide ($TiO_x$) and the first oxide resistive layer 23B is formed of nickel oxide ($NiO_x$), the reactive metal layer 26 may be formed of a single or stacked layer including a metal having a greater reactivity with respect to oxygen, e.g., gadolinium (Gd), than the titanium oxide ($TiO_x$) and the reactive metal layer 25 may be formed of a single or stacked layer including a metal having a greater reactivity with respect to oxygen than the nickel oxide ($NiO_x$), e.g., titanium (Ti). Also, each of the reactive metal layers 24, 25, 26 may be a single layer different from another reactive metal layer.

Using materials for forming the oxide resistive layers 23A, 23B and the reactive metal layers 24, 25, 26 as described above may improve the characteristics of the semiconductor device using a change in electrical resistance by controlling the distribution of the oxygen vacancies.

To be specific, the oxygen vacancies may have a uniform distribution in a vertical direction, or they may have a linear distribution in a vertical direction. Here, the vertical direction means a direction from the lower electrode 21 to the upper electrode 22. The oxygen vacancies inside the oxide resistive layers 23A, 23B and the reactive metal layers 24, 25, 26 having the linear distribution in the vertical direction signifies that the number of the oxygen vacancies is decreasing or increasing in a direction from the interface with the lower electrode 21 to the interface with the upper electrode 22.

Here, if the oxygen vacancies are distributed uniformly, the operation characteristics (e.g., switching characteristics and endurance characteristics) of the semiconductor device using a change in electrical resistance may be improved. More specifically, for example, a uniform distribution of the oxygen vacancies may result in stable switching characteristics of a ReRAM device.

On the other hand, if the oxygen vacancies have the linear distribution, the leakage current characteristics and set/reset operation characteristics, e.g., set/reset current and set/reset time, may be improved. This will be described in detail hereafter. In the following description, it is assumed that the distribution of the oxygen vacancies is such that the number of oxygen vacancies increases from the interface with the upper electrode 22 to the interface with the lower electrode 21.

First, if a ground voltage VSS is applied to the lower electrode 21 and a negative voltage VBB, which is lower than the ground voltage, is applied to the upper electrode 22, the oxygen vacancies inside the oxide resistive layers 23A, 23B and the reactive metal layers 24, 25, 26 may be rearranged to generate a conductive filament. Here, since the conductive filament is generated from the Lower electrode 21, the distribution of the oxygen vacancies may increase in a direction from the interface with the upper electrode 22 to the interface with the lower electrode 21. Therefore, the conductive filament may be easily generated so as to improve the set operation characteristics. Meanwhile, if a ground voltage VSS is applied to the lower electrode 21 and a positive voltage VDD, which is higher than the ground voltage, is applied to the upper electrode 22, the oxygen vacancies inside the oxide resistive layers 23A, 23B and the reactive metal layers 24, 25, 26 may be rearranged to deconstruct an existing conductive filament. Here, the conductive filament deconstructs as the oxygen on the interface with the upper electrode 22 fills the oxygen vacancies, or as the oxygen vacancies are transferred toward the lower electrode 21. Therefore, the conductive filament may deconstruct so that it stops electrically connecting the lower electrode 21 and the upper electrode 22. Therefore, in a structure where the number of oxygen vacancies decreases in a direction from the interface with the lower electrode 21 to the interface with the upper electrode 22, the conductive filament may be deconstruct more easily. Accordingly, the reset operation characteristics may be improved.

As oxygen is released and oxygen vacancies are created. The oxygen vacancies may function like particles having a positive charge, e.g., holes. However, a potential barrier between the lower electrode 21 and the upper electrode 22 is sufficient to effectively suppress a leakage current.

The reactive metal layer 24 interposed between multiple oxide resistive layers 23 in accordance with an exemplary embodiment of the present invention may generate a sufficient amount of oxygen vacancies while suppressing an increase in power consumption that may be caused by leakage current.

Also, the semiconductor device using a change in electrical resistance fabricated in accordance with an exemplary embodiment of the present invention may improve switching characteristics, endurance characteristics, and set/reset operation characteristics by controlling the distribution of the oxygen vacancies inside oxide resistive layers 23A, 23B and the reactive metal layers 24, 25, 26. If the oxygen vacancies inside oxide resistive layers 23A, 23B and the reactive metal layers 24, 25, 26 are uniformly distributed, excellent switching characteristics and endurance characteristics may be secured. Alternatively, if the oxygen vacancies are linearly distributed, excellent set/reset operation characteristics may be secured while improving leakage current characteristics more effectively.

FIGS. 4A to 4D are cross-sectional views illustrating a semiconductor device using a change in electrical resistance in accordance with another exemplary embodiment of the present invention.

Figure 4A:
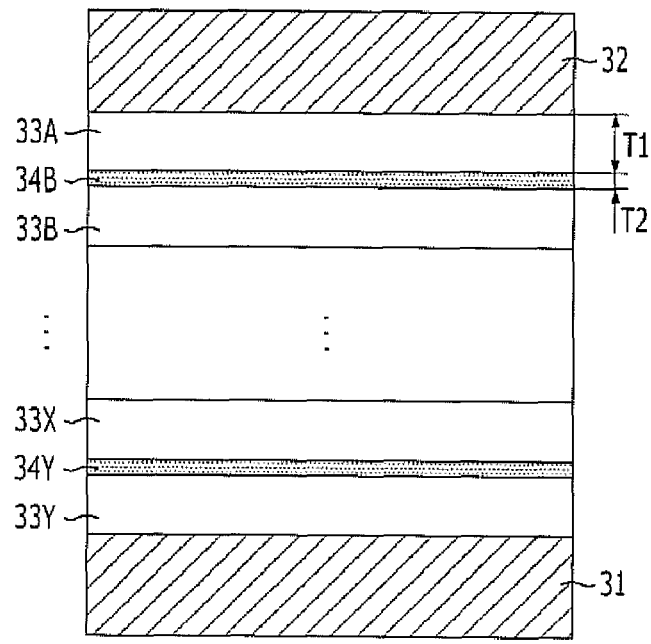
FIGS. 4A to 4D are cross-sectional views illustrating a semiconductor device using a change in electrical resistance in accordance with another exemplary embodiment of the present invention.
Figure 4B:
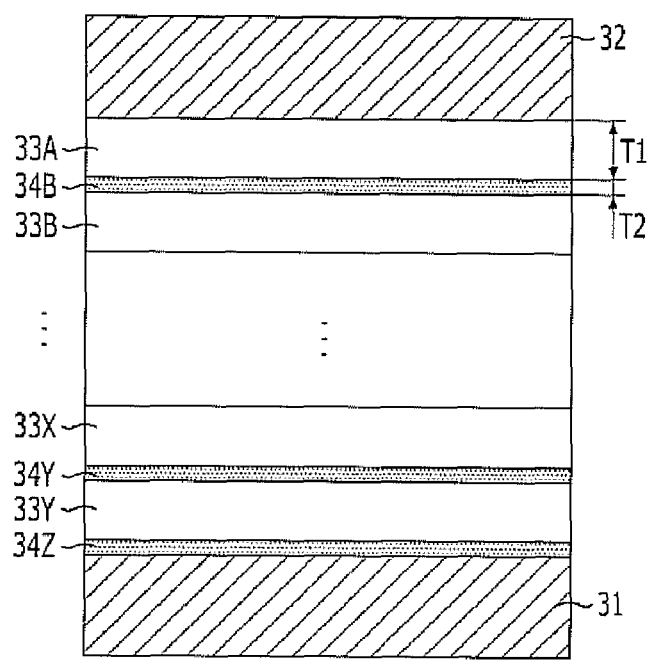
Figure 4C:
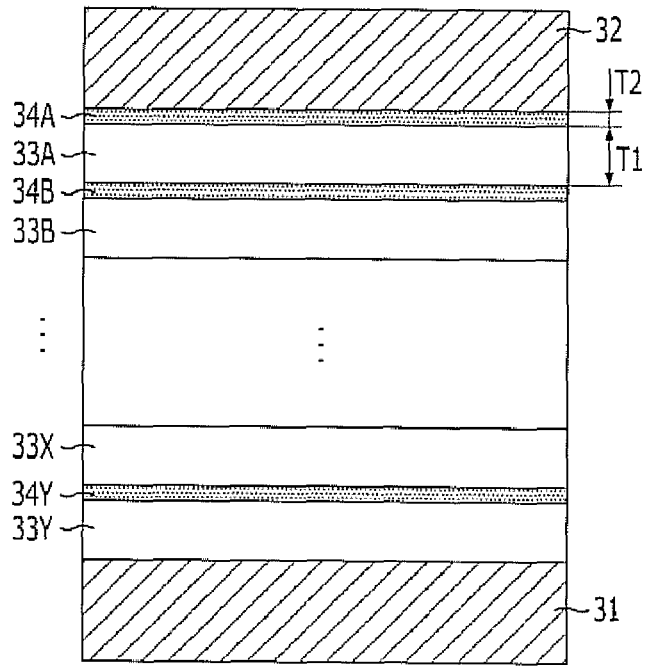
Figure 4D:
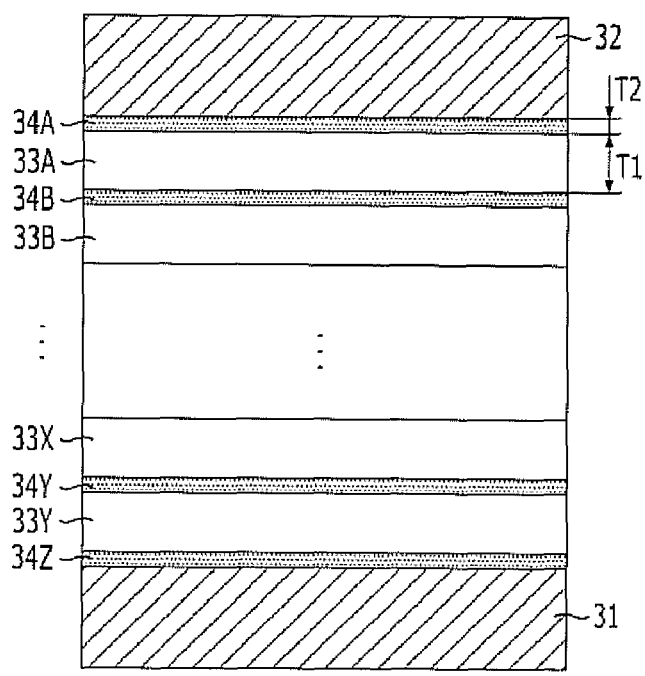

Referring to FIGS. 4A and 4D, the semiconductor device using a change in electrical resistance fabricated in accordance with this exemplary embodiment of the present invention may include a lower electrode 31, an upper electrode 32, a plurality of oxide resistive layers 33A, 33B, . . . , 33X, 33Y formed between the lower electrode 31 and the upper electrode 32, and a plurality of reactive metal layers 34B, . . . , 34Y formed between each of the plurality of oxide resistive layers.

Here, a plurality of oxide resistive layers 33A, 33B, . . . , 33X, 33Y and a plurality of reactive metal layers 34B, . . . , 34Y may be alternately stacked (i.e., oxide resistive layer/reactive metal layer/oxide resistive layer . . . oxide resistive layer/reactive metal layer/oxide resistive layer). Also, the reactive metal layer 34Z may be interposed between the lower electrode 31 and the oxide resistive layer 33Y, as illustrated in FIG. 4B. Alternatively, the reactive metal layer 34A may be interposed between the upper electrode 32 and the oxide resistive layer 33A, as illustrated in FIG. 4C. Also, the reactive metal layers 34A through 34Z may be respectively formed over the oxide resistive layers 33A through 33Y and the lower electrode 31, as illustrated in FIG. 4D.

The plurality of the oxide resistive layers 33A, 33B, ..., 33X, 33Y may include a transition metal oxide and they may be formed of the identical transition metal oxide or different transition metal oxides.

The reactive metal layers 34A, 34B, ..., 34Y, 34Z may be single layers each including any one metal or they may be stacked layers each including different metals. Here, the reactive metal layer 34A, 34B, ..., 34Y, 34Z may include a metal having a greater reactivity with respect to oxygen than the oxide resistive layers 33A, 33B, ..., 33X, 33Y which each of the reactive metal layers 34A, 34B, ..., 34Y, 34Z contacts.

For example, if the oxide resistive layers 33A, 33B, ..., 33X, 33Y are titanium oxide ($TiO_x$) layers, each of the reactive metal layers 34A, 34B, ..., 34Y, 34Z may be a single layer selected from the group consisting of an aluminum (Al) layer, a gadolinium (Gd) layer, a zirconium (Zr) layer, and a titanium (Ti) layer whose reactivity with respect to oxygen is greater than that of the titanium oxide ($TiO_x$) layer, or a stacked layer where more than two of them are stacked. Also, some or all of the reactive metal layers 34A, 34B, ..., 34Y, 34Z may be single layers different from the others.

Using the materials for forming the oxide resistive layers 33A, 33B, ..., 33X, 33Y and the reactive metal layers 34A, 34B, ..., 34Y, 34Z as described above may improve the characteristics of the semiconductor device using a change in electrical resistance by controlling the distribution of the oxygen vacancies.

Here, if the oxygen vacancies are distributed uniformly, the operation characteristics of the semiconductor device using a change in electrical resistance, such as stable switching characteristics and endurance characteristics, may be improved.

On the other hand, if the oxygen vacancies have the linear distribution, the leakage current characteristics and set/reset operation characteristics, e.g., set/reset current and set/reset time, may be improved.

If the oxide resistive layers 33 and the reactive metal layers 34 are alternately stacked, the semiconductor device using a change in electrical resistance may generate a sufficient amount of oxygen vacancies while suppressing an increase in power consumption that may be caused by leakage current.

Also, the semiconductor device using a change in electrical resistance fabricated in accordance with this exemplary embodiment of the present invention may improve switching characteristics, endurance characteristics, and set/reset operation characteristics by controlling the distribution of the oxygen vacancies. Here, if the oxygen vacancies inside the oxide resistive layers 33A, 33B, ..., 33X, 33Y and the reactive metal layers 34A, 34B, ..., 34Y, 34Z are uniformly distributed, switching characteristics and endurance characteristics may be secured. If the oxygen vacancies are linearly distributed, set/reset operation characteristics may be secured while improving leakage current characteristics.

Figure 5:
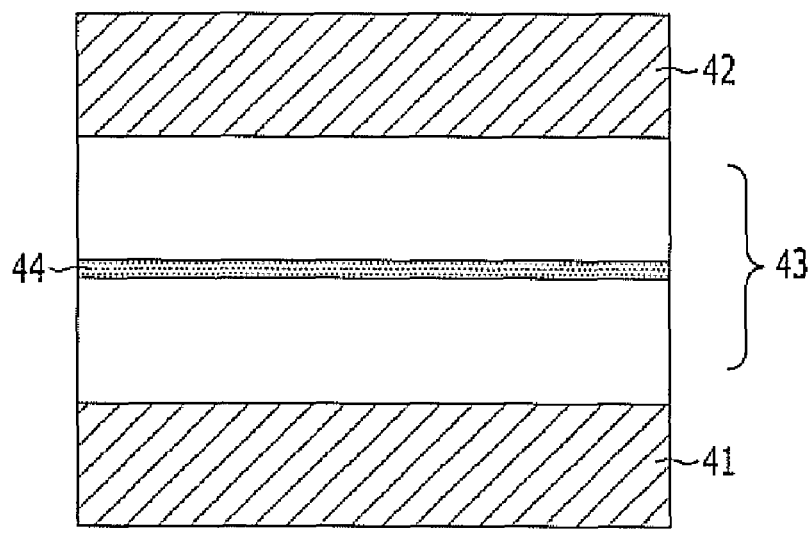
FIG. 5 is a cross-sectional view illustrating a semiconductor device using a change in electrical resistance in accordance with yet another exemplary embodiment of the present invention.

FIG. 5 is a cross-sectional view illustrating a semiconductor device using a change in electrical resistance in accordance with yet another exemplary embodiment of the present invention.

Referring to FIG. 5, the semiconductor device using a change in electrical resistance fabricated in accordance with this exemplary embodiment of the present invention may include a lower electrode 41, an upper electrode 42, and a variable resistance layer 43 arranged between the lower electrode 41 and the upper electrode 42, wherein a reactive metal region 44 is arranged in the variable resistance layer.

Here, the variable resistance layer 43 may have a structure where a reactive metal region 44 is arranged in the variable resistance layer 43, for example, in the middle of the variable resistance layer 43, as illustrated n FIG. 5.

FIGS. 6A to 6D are cross-sectional views describing a method for fabricating a semiconductor device using a change in electrical resistance in accordance with an exemplary embodiment of the present invention.

Figure 6A:
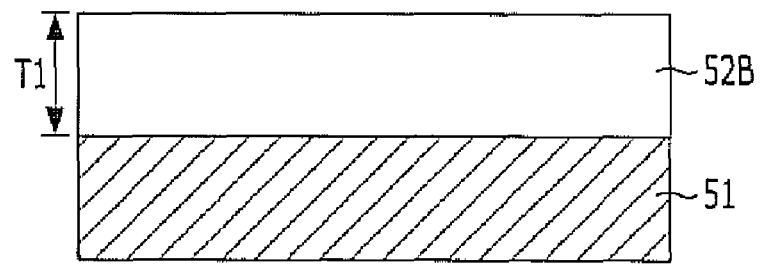
FIGS. 6A to 6D are cross-sectional views describing a method for fabricating a semiconductor device using a change in electrical resistance in accordance with an exemplary embodiment of the present invention.

Referring to FIG. 6A, a lower electrode 51 is formed. The lower electrode 51 may be a metal layer formed through a Chemical Vapor Deposition (CVD) process, a Physical Vapor Deposition (PVD) process, or an Atomic Layer Deposition (ALD) process.

Subsequently, a first oxide resistive layer 52B may be formed over the lower electrode 51. Here, the first oxide resistive layer 52B may be formed of a transition metal oxide to have a thickness T1 ranging from approximately 10 nm to approximately 100 nm.

The first oxide resistive layer 52B may be formed through a CVD process, a PVD process, or an ALD process. Here, to improve the switching characteristics of the semiconductor device using a change in electrical resistance, the first oxide resistive layer 52B may be formed through the ALD process, because a thin film formed through the ALD process may have a more uniform thickness than that of a film formed through the CVD process or the PVD process.

Meanwhile, oxygen vacancies may be generated inside the first oxide resistive layer 52B while forming the first oxide resistive layer 52B through the ALD process. However, since the first oxide resistive layer 52B formed through the ALD process may have a stoichiometrically stable structure where there are relatively few impurities inside the first oxide resistive layer 52B, the amount of the generated oxygen vacancies may not be enough to secure the switching characteristics required by the semiconductor device using a change in electrical resistance.

Figure 6B:
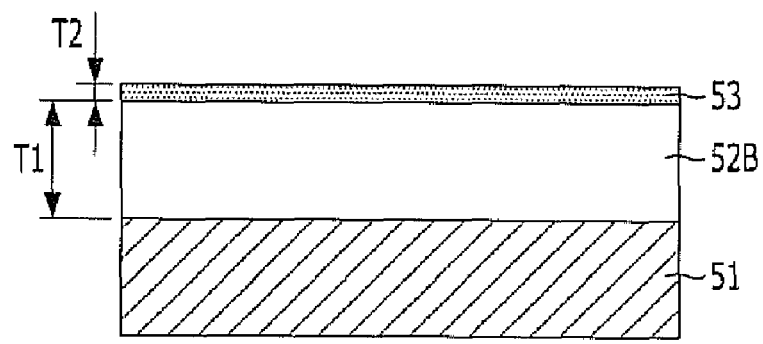

Therefore, to generate a sufficient amount of oxygen vacancies inside the first oxide resistive layer 52B, a reactive metal layer 53 may be formed over the first oxide resistive layer 52B, as illustrated in FIG. 6B. Here, the reactive metal layer 53 may increase the number of oxygen vacancies inside the first oxide resistive layer 52B and the second oxide resistive layer 52A which will be formed in a subsequent process. Furthermore, the reactive metal layer 53 may be formed through a CVD process, a PVD process, or an ALD process. In particular, the ALD process may be used to form the reactive metal layer 53 with a uniform thickness.

The reactive metal layer 53 may be formed of a material having a greater reactivity with respect to oxygen than the first oxide resistive layer 52B and a second oxide resistive layer52A. This is so that oxygen vacancies inside the first oxide resistive layer 52B and the second oxide resistive layer 52A may be formed more efficiently. For example, if the first oxide resistive layer 52B is formed of a titanium oxide, the reactive metal layer 53 may be formed of gadolinium (Gd), which has a greater reactivity with respect to oxygen than the titanium oxide.

The reactive metal layer 53 may be formed to have a thickness T2 which is thinner than the thickness T1 of the first oxide resistive layer 52B. For example, the thickness T2 of the reactive metal layer 53 may range from approximately 1% to approximately 10% of the thickness T1 of the first oxide resistive layer 32. More specifically, for example, the reactive metal layer 53 may be formed to have a thickness T2 ranging from approximately 1 nm to approximately 10 nm.

Here, the reactive metal layer 53 formed over the first oxide resistive layer 52B may be transitioned into a metal oxide through an oxidation by oxygen gathered from the first oxide resistive layer 52B during a deposition and a subsequent annealing process.

Figure 6C:
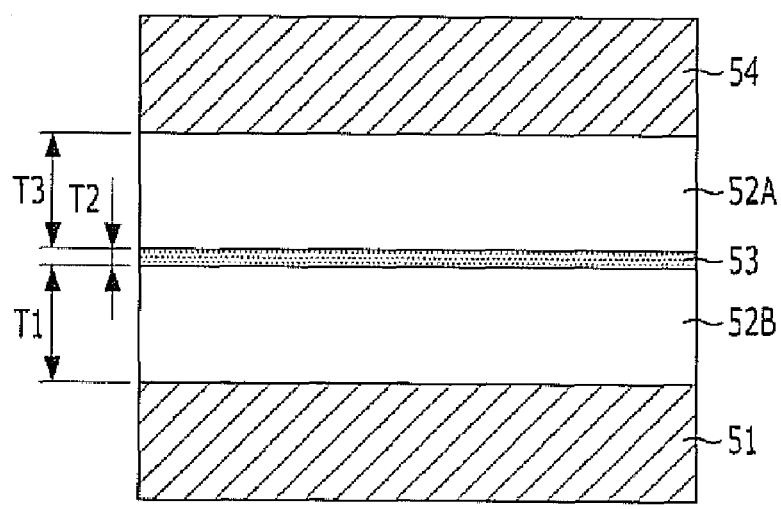

Referring to FIG. 6C, a second oxide resistive layer 52A may be formed over the reactive metal layer 53. Here, the second oxide resistive layer 52A may be formed of a transition metal oxide. Further, it may be formed of the same transition metal oxide as the first oxide resistive layer 52B is formed of, or of a different transition metal oxide than the first oxide resistive layer 52B.

The second oxide resistive layer 52A may be formed to have a thickness T3 thicker than that of the reactive metal layer 53. The thickness T3 of the second oxide resistive layer 52A may have the same thickness as the thickness T1 of the first oxide resistive layer 52B, or may have a different thickness than that of the first oxide resistive layer 52B.

Through the process described above, a stacked structure where the first oxide resistive layer 52B, the reactive metal layer 53 and the second oxide resistive layer 52A are sequentially stacked may be formed.

Subsequently, an upper electrode 54 may be formed over the second oxide resistive layer 52A.

Figure 6D:
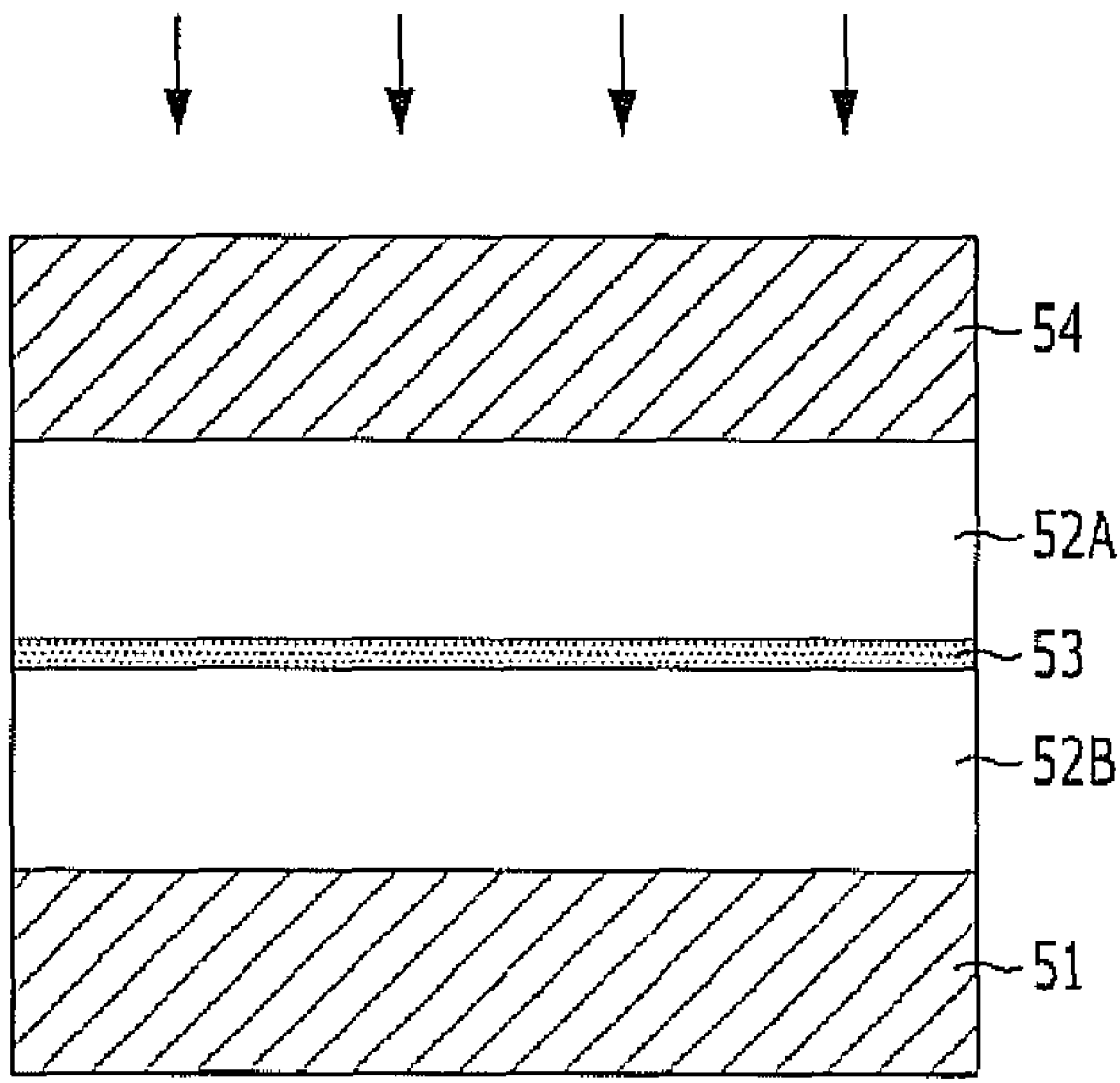

Referring to FIG. 6D, an annealing process may be performed to generate a sufficient amount of oxygen vacancies inside the first oxide resistive layer 52B and the second oxide resistive layer 52A, and, at the same time, to uniformly distribute the oxygen vacancies inside the first oxide resistive layer 52B and the second oxide resistive layer 52A. Here, the annealing process may be performed before the formation of the upper electrode 54.

The annealing process may be performed to generate a sufficient amount of oxygen vacancies inside the first oxide resistive layer 52B and the second oxide resistive layer 52A and simultaneously to oxidize the reactive metal layer 53 remaining unreacted. When the reactive metal layer 53 is not oxidized, the electrical characteristics of the semiconductor device using a change in electrical resistance may be deteriorated. After the annealing process, the reactive metal layer 53 may have a plurality of oxygen vacancies and may be in a stoichiometrically unstable state.

Through the fabrication process described above, the semiconductor device using a change in electrical resistance illustrated in FIG. 3A may be fabricated. Although, a method for fabricating the semiconductor device using a change in electrical resistance illustrated in FIG. 3A is described herein, those skilled in the art may understand methods for fabricating the semiconductor device using a change in resistance illustrated in FIGS. 3B to 3D, FIGS. 4A to 4D and FIG. 5 as well from the above-described semiconductor device fabrication method.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a lower electrode;
   a variable resistance layer disposed over the lower electrode, wherein the variable resistance layer is included a plurality of oxide resistive layers and a reactive metal layer being interposed between the plurality of the oxide resistive layers; and
   an upper electrode disposed over the variable resistance layer,
   wherein the reactive metal layer gathers oxygen from the oxide resistive layers.

2. The semiconductor device of claim 1, wherein the reactive metal layer comprises a metal having a greater reactivity with respect to oxygen than the plurality of oxide resistive layers.

3. The semiconductor device of claim 1, wherein the reactive metal layer and the oxide resistive layers have oxygen vacancies.

4. The semiconductor device of claim 1, wherein the plurality of the oxide resistive layers comprise an identical material or different materials.

5. The semiconductor device of claim 1, wherein one of the plurality of oxide resistive layers comprises a transition metal oxide.

6. The semiconductor device of claim 1, wherein the reactive metal layer comprises a stacked layer where a plurality of metal layers are stacked.

7. The semiconductor device of claim 6, wherein the plurality of the metal layers comprise an identical metal or different metals.

8. The semiconductor device of claim 1, further comprising another reactive metal layer interposed between the variable resistance layer and the upper electrode or between the variable resistance layer and the lower electrode.

9. The semiconductor device of claim 1, further comprising a first reactive metal layer interposed between the variable resistance layer and the upper electrode and a second reactive metal layer interposed between the variable resistance layer and the lower electrode.

10. The semiconductor device of claim 1, wherein the variable resistance layer comprises a plurality of oxygen vacancies therein, and the plurality of oxygen vacancies have a uniform distribution or a linear distribution in the variable resistance layer.

11. The semiconductor device of claim 1, wherein the reactive metal layer has a thickness thinner than a thickness of the plurality of oxide resistive layers.

12. A semiconductor device, comprising:
    a lower electrode;
    an upper electrode; and
    a variable resistance layer arranged between the lower electrode and the upper electrode, wherein the variable resistance layer is included a plurality of oxide resistive layers and a plurality of reactive metal layers formed between each of the plurality of oxide resistive layers;
    wherein one of the plurality of reactive metal layers gathers oxygen from one of the adjacent oxide resistive layers.

13. The semiconductor device of claim 12, wherein one of the plurality of reactive metal layers comprises a metal having a greater reactivity with respect to oxygen than one of the plurality of oxide resistive layers.

14. The semiconductor device of claim 12, wherein the plurality of reactive metal layers and the oxide resistive layers have oxygen vacancies.

15. The semiconductor device of claim 12, wherein each of the plurality oxide resistive layers comprises an identical material or different materials.

16. The semiconductor device of claim 12, wherein one of the plurality oxide resistive layers comprises a transition metal oxide.

17. The semiconductor device of claim 12, wherein each of the plurality reactive metal layers comprises an identical metal or different metals.

18. The semiconductor device of claim 12, further comprising another reactive metal layer interposed between the variable resistance layer and the upper electrode or between the variable resistance layer and the lower electrode.

19. The semiconductor device of claim 12, further comprising a first reactive metal layer interposed between the variable resistance layer and the upper electrode and a second reactive metal layer interposed between the variable resistance layer and the lower electrode.

20. The semiconductor device of claim 12, wherein one of the plurality reactive metal layers comprises a stacked layer where a plurality of metal layers are stacked.

21. The semiconductor device of claim 20, wherein the plurality of the metal layers comprise an identical metal or different metals.

22. The semiconductor device of claim 12, wherein the variable resistance layer comprises a plurality of oxygen vacancies therein, and the plurality of oxygen vacancies have a uniform distribution or a linear distribution in the variable resistance layer.

23. The semiconductor device of claim 12, wherein one of the reactive metal layers has a thickness thinner than a thickness of the adjacent oxide resistive layers from among the plurality of oxide resistive layers.

* * * * *